United States Patent [19]
Fenton et al.

[11] 4,065,936
[45] Jan. 3, 1978

[54] COUNTER-FLOW THERMOELECTRIC HEAT PUMP WITH DISCRETE SECTIONS

[75] Inventors: John William Fenton, Wilmette; Jerry Stevenson Lee, Buffalo Grove; Richard James Buist, Palatine, all of Ill.

[73] Assignee: Borg-Warner Corporation, Chicago, Ill.

[21] Appl. No.: 696,605

[22] Filed: June 16, 1976

[51] Int. Cl.² .......................................... F25B 21/02
[52] U.S. Cl. ............................................................. 62/3
[58] Field of Search ............................................... 62/3

[56] References Cited

U.S. PATENT DOCUMENTS

| | | | |
|---|---|---|---|
| 3,024,616 | 3/1962 | Bury | 62/3 |
| 3,040,538 | 6/1962 | Alsing | 62/3 |
| 3,137,142 | 6/1964 | Venema | 62/3 |
| 3,197,342 | 7/1965 | Neild, Jr. | 62/3 |
| 3,552,133 | 1/1971 | Lukomsky | 62/3 |
| 3,956,902 | 5/1976 | Fields, Jr. | 62/3 |

FOREIGN PATENT DOCUMENTS

| | | | |
|---|---|---|---|
| 780,726 | 8/1957 | United Kingdom | 62/3 |
| 894,341 | 4/1962 | United Kingdom | 62/3 |

Primary Examiner—Lloyd L. King
Attorney, Agent, or Firm—James J. Jennings

[57] ABSTRACT

Thermoelectric heat pumps using parallel flow, cross-flow, or counter-flow of the input and output fluid streams have been designed and built, but performance has been insensitive to flow arrangement due to the use of one-piece, essentially isothermal heat exchangers on the heated and cooled thermoelectric junctions. Thus, none of these designs have capitalized on the sensitivity of the thermoelectric coefficient of performance to the junctions temperature differences and the smaller temperature differences possible with the counter-flow arrangement. In the improved design, the thermoelectric heat pump is broken down into discrete sections which heat or cool the input fluid in stages. The system thus operates as several discrete heat pumps each doing only a small portion of the heat pumping without sacrificing the desired final outlet temperature. Thus, the junction temperature differentials for each thermoelectric unit in the system is less than that with conventional one-piece heat sink designs. Consequently, the coefficient of performance or "heat pump efficiency" of the sectioned system is significantly improved.

8 Claims, 7 Drawing Figures

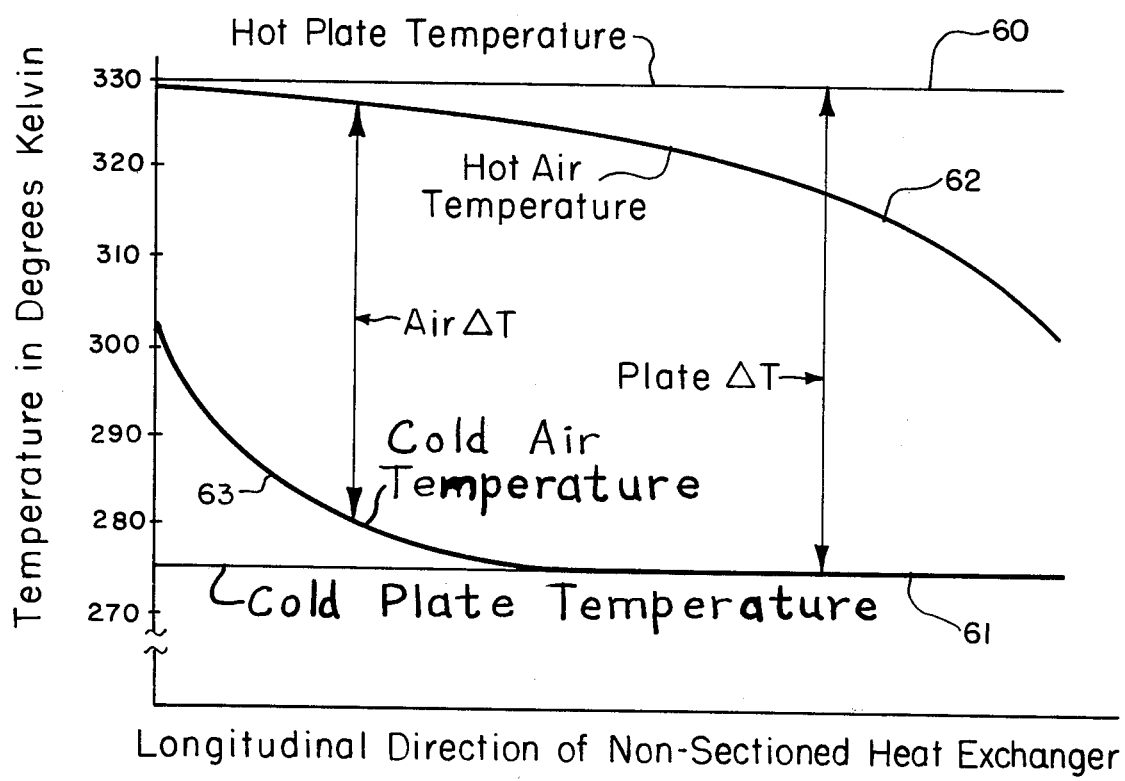
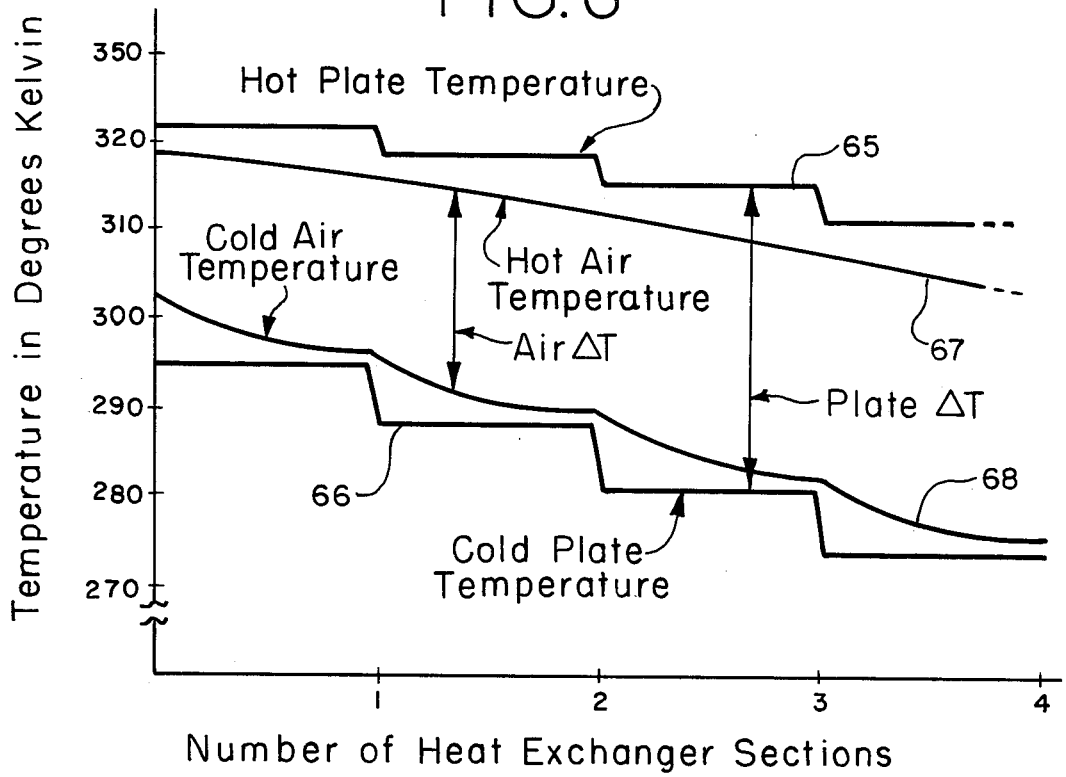

COUNTER-FLOW THERMOELECTRIC HEAT PUMP WITH DISCRETE SECTIONS

BACKGROUND OF THE INVENTION

For over one hundred years the basic principles of thermoelectricity have been known and utilized. When two dissimilar metals are combined into one thermoelectric element, and unidirectional current is passed through this element, a temperature difference is created across the material; this is the Peltier effect. Conversely, a temperature difference can be applied across the element and a potential difference produced; this phenomenon is termed the Seebeck effect. In view of the Peltier effect, individual thermoelectric elements of p-type and n-type materials have been produced, and a multiplicity of the elements are then joined to provide a thermoelectric module. Thus by energizing the module, a temperature difference can be produced across its opposite surfaces. The techniques for producing such thermoelectric modules are now well known and are described, by way of example, in U.S. Pat. Nos. 3,247,577 and 3,247,578, both of which are assigned to the assignee of this application. Hence the term "thermoelectric module", as used herein and in the appended claims, refers to a plurality of individual thermoelectric elements assembled in a unitary package to provide a temperature difference across the module when electrical energy is supplied to the circuit including the individual elements.

After the provision of individual modules, thermoelectric heat pumps were produced by assembling a plurality of modules between two heat exchangers. In many cases the heat exchangers were simply thermally conductive plates. In the case of fluid cooling or heating, fins were generally needed in the exchangers to assist in exchanging heat between the exchanger and the fluid. Counter fluid flow was preferable because smaller temperature differences were present at the inlets and outlets, thus minimizing heat leakage and improving overall performance. Smaller temperature differences inside the exchangers and consequently higher efficiencies are possible with counter fluid flow, but longitudinal heat conduction due to longitudinal fins in addition to the fin plate results in near isothermal exchangers, nullifying the potential advantage of counter-flow.

It is therefore a primary object of the present invention to provide a counter-flow thermoelectric heat pump which is substantially more efficient than previous counter-flow thermoelectric heat pumps.

A more specific object of the invention is to substantially reduce the longitudinal conduction of heat within the heat exchanger, to obtain the advantage of counter fluid flow and thus reduce the temperature difference that the thermoelectric modules must produce.

SUMMARY OF THE INVENTION

A counter-flow thermoelectric heat pump constructed in accordance with the invention comprises first and second thermoelectric modules, both disposed in substantially the same plane. The thermoelectric modules are electrically intercoupled so as to transfer heat from one side of the modules to the other side when they are energized. Means, such as flat plates, are disposed around the thermoelectric modules to define a first channel for fluid flow in a first direction over one surface of the thermoelectric modules, and a second channel for fluid flow in a second direction, opposite the first direction, over the other surface of the thermoelectric modules.

Particularly in accordance with this invention, a thermal barrier is interposed between the first and second thermoelectric modules, to preclude longitudinal heat conduction along the outer surfaces of the thermoelectric modules.

The invention is particularly useful in a heat pump assembly including additional thermoelectric modules, with means defining a third channel for fluid flow in the same direction as the first channel. The first and third channels are on the outer portions of the heat pump, and the second channel is in the center of the heat pump. A fourth channel, and additional channels as desired, can readily be provided by incorporating additional sandwich layers of thermoelectric modules and channel-defining hardware. The direction of air flow in each added channel is opposite that of the adjacent channel; for example, the air flow in the fourth channel is counter the flow direction in the third channel.

THE DRAWINGS

In the several figures of the drawings, like reference numerals identify like components, and in those drawings:

FIGS. 5, 6 and 7 are graphical illustrations showing the temperature differences and power consumption in a conventional thermoelectric heat pump as contrasted to the sectioned counter-flow thermoelectric heat pump constructed in accordance with this invention.

DETAILED DESCRIPTION OF THE INVENTION

For simplicity, the invention is described for an air-to-air system. The concepts apply when other fluids are employed.

Figure 1:
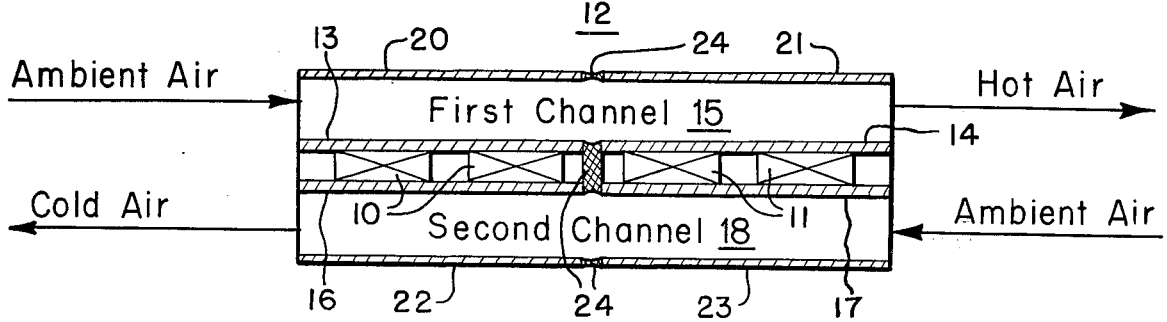
FIG. 1 is a simplified side view of a counter-flow two-channel thermoelectric heat pump constructed in accordance with the present invention.

FIG. 1 depicts, in simplified form, a two channel, counter-flow thermoelectric heat pump constructed in accordance with the invention. In the center of the assembly, a first pair of thermoelectric modules 10 and a second pair of thermoelectric modules 11 are both disposed in substantially the same plane along the longitudinal axis of the heat pump assembly 12. Of course, only a single module of the illustrated pair 10 could be employed, and likewise only a single module 11 could be employed in lieu of the two shown in the right portion. A hot plate assembly, divided into two segments 13 and 14, is provided in the first upper channel 15, and a cold plate assembly comprised of segments 16, 17 is positioned below the modules abutting the second channel 18. Section or cover plates 20, 21 are provided above the first channel 15 to assist in defining this channel together with the hot plate segments 13, 14. Likewise lower cover plates 22, 23 are provided to complete the definition of the second channel 18 below the cold plate. The thermoelectric modules are electrically intercoupled in a circuit which is not shown but is well known and understood by those skilled in the art. Thus upon energizing the modules, heat is passed from the cold plate segments 16, 17 into the modules to the hot plate segments 13, 14. In this way the ambient air passing through the second channel is cooled, and the ambient air passing in the opposite direction through the first channel removes the heat rejected by the modules.

Particularly in accordance with this invention, a thermal barrier 24 is interposed between the first and second sets of thermoelectric modules. This barrier separates the hot and cold plate assemblies, the upper cover or section plates 20, 21 and the lower section plates 22, 23. In this way the longitudinal heat transfer along the hot and cold plates and the top and bottom cover plates is minimized, and the efficiency of the overall system is enhanced.

Figure 2:
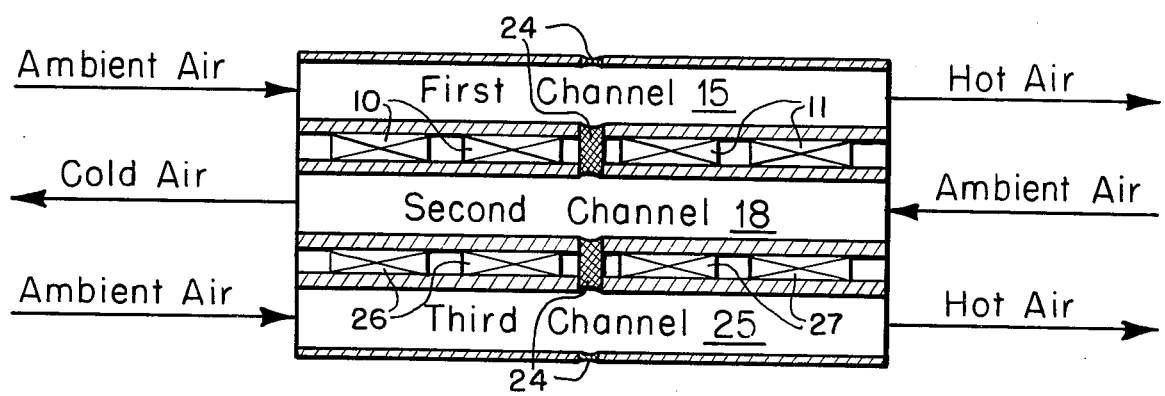
FIG. 2 is a simplified view of a three-channel system depicting the air flow.

To improve the efficiency of a counter-flow system, it is desirable to have an additional air-conduction channel as shown in FIG. 2. That is, a third channel 25 is added to provide for conduction of air over another set of thermoelectric modules 26, 27. In this way the ambient air in the second or center channel 18 is further cooled by the additional modules 26, 27 and the heat pumped by these modules is removed to the third channel 25. This simplified diagram of the three-channel system will be better understood in connection with the exploded view of FIG. 3.

Figure 3:
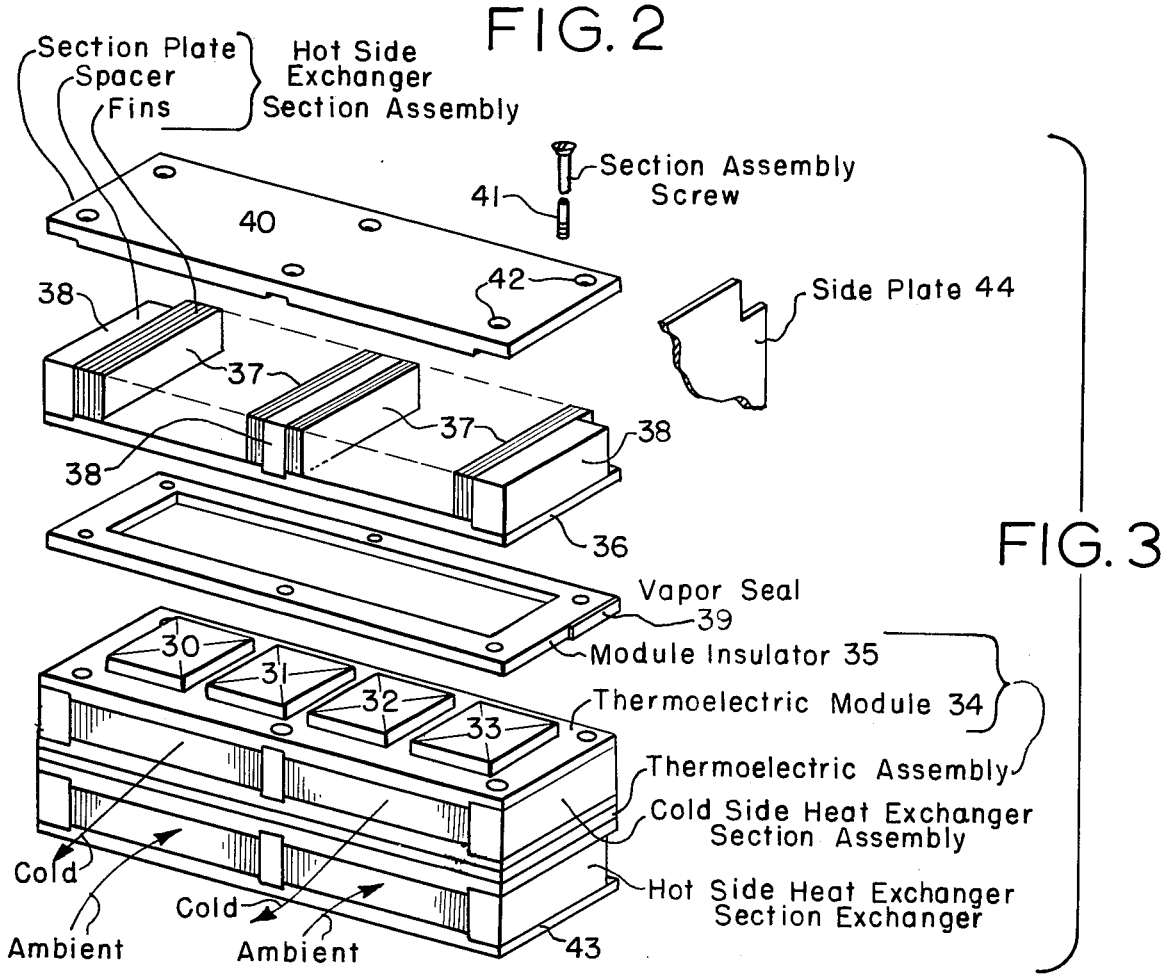
FIG. 3 is a perspective, exploded view illustrating the assembly of one section in a five-section counter-flow thermoelectric heat pump.

FIG. 3 illustrates one section of a three-channel counter-flow heat pump constructed in accordance with this invention. As there shown a plurality of thermoelectric modules 30, 31, 32 and 33 are provided to pump heat between the first and second channels. A similar plurality of thermoelectric modules are provided for the other interface between the second and third channels but are not visible in this showing. The modules can be laid directly on the thermally conductive cold plate 34, which can be of aluminum, copper or other suitable material. A module insulator 35 of polyurethane or a similar material is positioned around the modules, and the hot plate 36 abuts the upper portion of the modules in the assembled position. In accordance with the teachings in this art a good thermal conductor such as a silicone grease can be employed to enhance the thermal conductivity across the hot and cold plates where they contact the modules. Alternatively solder, thermally conductive epoxy, or other materials can be used to improve the heat transfer at these locations. The fin assembly including a plurality of fins 37 and spacers 38 is then provided over the hot plate 36, and the section plate or top cover 40 completes the definition of the upper channel for air flow past the fins 37. Actually there are two upper channels for air flow because the intermediate spacer 38 effectively divides the first channel into two separate channels. Section assembly screws such as screw 41 are passed through the apertures 42 in the section plate 40 for receipt in the corresponding tapped portions of section plate 43 on the opposite side of the heat exchanger section. The assembly of the other thermoelectric modules between the second and third channels is apparent from the showing in FIG. 3 of the location of upper modules 30-33. Only a segment of the side plate 44 is illustrated, as the side plate extends along the entire heat pump as better shown in FIG. 4.

Figure 4:
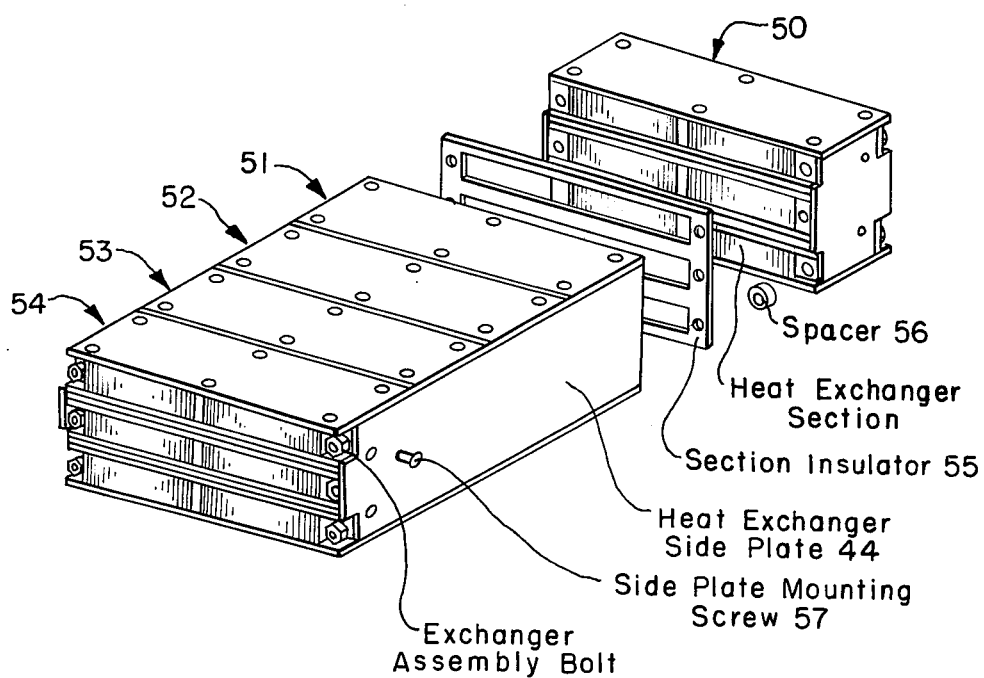
FIG. 4 is a perspective view, partly exploded, depicting a five-section counter-flow thermoelectric heat pump.

After assembly according to the description in connection with FIG. 3, one complete heat pump section 50 is provided as shown in FIG. 4. When constructing a five section heat pump this procedure is repeated to provide for additional sections 51-54 as shown. However it is important to emphasize that a substantial efficiency improvement in thermoelectric heat pumps as disclosed herein is attained with only two sections, and the five sections are shown for purposes of illustration. The efficiency improvements are increased by the addition of more sections because the temperature difference ($\Delta T$) for each section is reduced as the number of sections in the assembly is increased.

One of the thermal barriers or sections insulators 55 is shown in FIG. 4, between the heat pump sections 50 and 51. In one embodiment such insulators were made of silicone rubber and positioned as shown, the insulators were fabricated with apertures to position spacing washers 56, which control the compression applied to the insulators by the exchanger assembly tie bolt. This tie bolt passing through the spacer provides appropriate alignment for the assembly. Note that the insulators preclude longitudinal transfer of heat by the adjacent modules, by the segments of the hot and cold plates, and by the cover plates of the complete assembly. Although the sectioned insulators do not abut or interrupt the heat transfer fins, the fins terminate in each section and thus are not longitudinal heat conductors from one section to another of the thermoelectric heat pump. When all the individual sections are in position, the side plate mounting screws 57 are fastened in place to complete the heat pump assembly.

The foregoing explanation is applicable with current being supplied to the modules in a given direction, and the heat pump in the cooling mode so that the ambient air is cooled as it passes through center channel 18. If the direction of the current flow is reversed the ambient air entering the center channel is heated, then the air exhausted from the first and the third channels is cooled.

TECHNICAL ADVANTAGES

Contrary to the accepted techniques for counterflow thermoelectric heat exchangers, a sectioned heat pump constructed as shown in FIGS. 3 and 4 can use as much fin surface as desired and still obtain the full advantage of the counter air flow. As contrasted to conventional heat pumps, the individual sections separated by thermal barriers allow operation of the modules at reduced temperature differences. This in turn increases the coefficient of performance (COP), and reduces the electrical power input required for a given thermal load. The sectioned thermoelectric heat pump can use normal single-stage modules, or multi-stage modules. The particular fins used in the exchangers can readily be optimized to satisfy particular system requirements for performance, pressure drop, weight, and so forth. Any type of fin structure can be used. The fins may range from simple flat fins to any of the different high-performance interrupted fins, such as louvered fins, rectangular interrupted fins, in-line interrupted fins, pin-fins, and other types.

The improvements realized by sectioning a thermoelectric heat pump along the longitudinal axis are best understood by comparing the data shown in FIGS. 5 and 6. In FIG. 5 different temperature functions for a conventional one-section thermoelectric heat exchanger are illustrated. Uniformity of the hot and cold plate temperature is shown by the straight lines 60 and 61, representing measurements taken from a conventional system. The hot air temperature is represented by the curve 62, and the cool air temperature is depicted by the curve 63. The air $\Delta T$ and plate $\Delta T$ are represented to provide a visual reference for these temperature differences as contrasted to the improvements realized by the present invention.

FIG. 6 sets out the data illustrating the substantial increase in efficiency obtained by the provision of thermal barriers along the longitudinal axis of the counter-flow thermoelectric heat pump. The hot plate temperature is represented by the staircase curve 65, and the cold plate temperature by the other staircase curve 66. The hot air temperature is represented by the curve 67 and the cold air temperature by the curve 68. Because the heat pump is effectively interrupted by the thermal barriers or insulators to prevent the unwanted longitudinal heat transfer, each section is forced to work or operate individually, at its own temperature difference. Because each section operates at a much reduced ΔT as contrasted to that of the entire system shown in FIG. 5, the sectioned heat pump results shown in FIG. 6 indicate that the modules operate much more efficiently. That is, the thermoelectric modules operate at a high cooling efficiency or high COP, in that the COP is an inverse function of the temperature difference (as a first order approximation). Because of this increased efficiency, less electrical power is required by each stage and by the system as a whole, and thus the rate of heat exhaustion is reduced. Accordingly, the heat exchangers can run substantially cooler, with a subsequent further reduction in the plate-to-plate temperature difference, and a further improvement in the total system performance.

Figure 7:
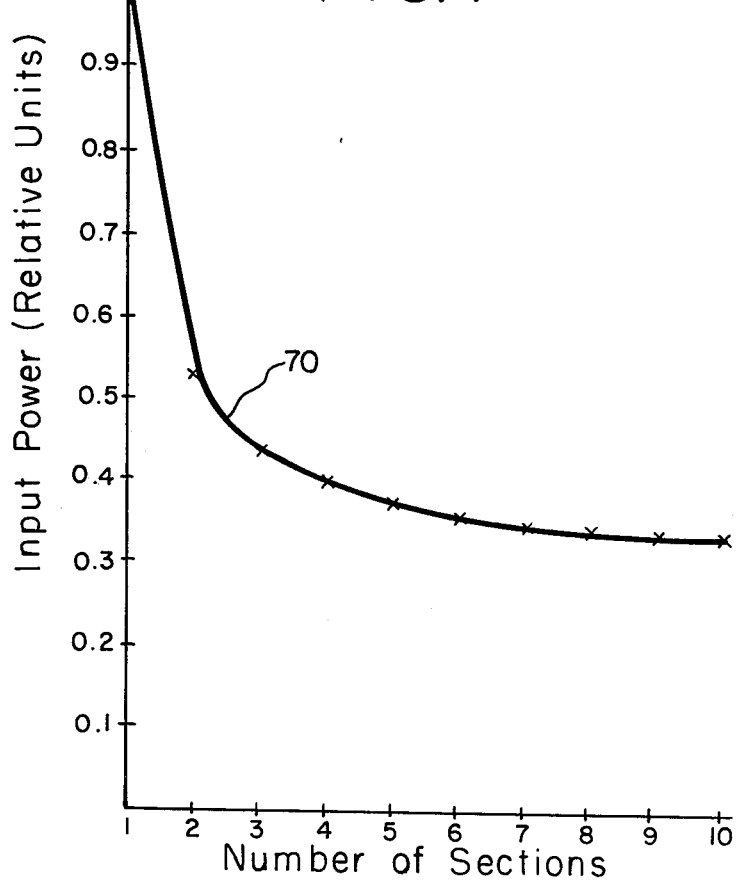

The substantially reduced power requirements are best understood in connection with FIG. 7. The input power required to obtain a difference of approximately 50° F. between the inlet and outlet temperatures is taken as the reference, and shown as 1.0 on the ordinate scale. That is, this represents the electrical power required to attain this temperature difference with a one-section counter-flow thermoelectric heat pump. The largest power reduction, in going from a one-section to the two-section thermoelectric cooler, is dramatically illustrated on the curve 70. When the longitudinal or axial dimension of the complete system is held fixed, the addition of more (but progressively smaller) sections continues to reduce the input power required, but at a rate which continually decreases.

System analyses has shown that the optimum performance for the sectioned counter-flow thermoelectric heat pump is achieved when all the individual sections have an equal coefficient of performance (COP). This optimum condition is achieved by adjusting the geometry or the temperature distribution in each individual heat exchanger section to provide equal COPs. The thermoelectric modules are also optimized for each exchanger section, but they can readily be designed to draw the same current in each section and thus allow the thermoelectric elements to be electrically intercoupled in a series circuit, or in a series-parallel circuit for ease of operation.

The performance improvements obtained with the sectioned arrangement of this invention make counter-flow thermoelectric heat pumps competitive with more conventional cooling systems. The heat pumps of this invention are especially compatible with requirements for compact, precise systems such as used in the aerospace industry for precise regulation of the temperature in a system for cooling onboard computers, an inertial guidance system, and similar complex control systems. The thermoelectric modules have the distinct advantage of being able to heat, cool, and maintain a desired temperature with a simple feedback control system which regulates the level of the current supplied to the thermoelectric modules. Such feedback systems have no moving parts, and thus are generally lighter, more compact, and more effective and reliable than competitive temperature control systems.

While only a particular embodiment of the invention has been described and claimed, it is apparent that various modifications and alterations may be made therein. It is therefore the intention of the appended claims to cover all such modifications and alterations as may fall within the true spirit and scope of the invention.

What is claimed is:

1. A counter-flow thermoelectric heat pump comprising:

a first thermoelectric module and a second thermoelectric module, both disposed in substantially the same plane, and electrically intercoupled so as to transfer heat from one side of the modules to the other side when the modules are energized;

means, including cover plates, disposed around the thermoelectric modules, to define a first channel for air flow in a first direction over one surface of the thermoelectric modules, and a second channel for air flow in a second direction opposite the first direction, over the other surface of the thermoelectric modules; and a thermal barrier, interposed between the first and second thermoelectric modules and between the cover plates, to minimize longitudinal heat conduction across the barrier in the heat pump modules.

2. A counter-flow thermoelectric heat pump as claimed in claim 1, in which the channel-defining means includes:

a first hot plate and a first cold plate disposed on either side of the first thermoelectric module, and a second hot plate and a second cold plate disposed on either side of the second thermoelectric module, with said thermal barrier interposed between said hot plates and said cold plates to minimize longitudinal heat conduction across the barrier.

3. A counter-flow thermoelectric heat pump as claimed in claim 2, and further comprising:

third and fourth thermoelectric modules, both disposed in substantially the same plane which is parallel to, but displaced from, the plane in which the first and second thermoelectric modules are disposed, with the third and fourth modules also being electrically intercoupled so as to transfer heat from one side of the modules to the other when electrical energy is supplied to the modules; and additional means, including respective hot and cold plates disposed adjacent the third and fourth modules, to cooperate in defining said second channel for air flow in said second direction and further defining a third channel for air flow in the same direction as the air flow in said first channel, with said thermal barrier being interposed between the third and fourth thermoelectric modules and their associated hot and cold plates to preclude longitudinal heat conduction across the thermal barrier.

4. A multi-section counter-flow thermoelectric heat pump system comprising a plurality of individual sections, with each section including:

a first plurality of thermoelectric modules positioned in substantially the same first plane with a hot plate affixed to one side and a cold plate affixed to the other side of the thermoelectric modules;

a second plurality of thermoelectric modules, with a second hot plate affixed to one side and a second cold plate affixed to the other side of the second plurality of thermoelectric modules, with the said second plurality of modules being disposed in a plane substantially parallel to but displaced from the first plane;

means, including said hot and cold plates and additional top and bottom section plates, defining a central channel for air flow in a given direction and two outer channels for air flow in a second direction opposite the given direction; and a section insulator, positioned to abut the hot and cold plates and the top and bottom section plates, to minimize longitudinal heat conduction between adjacent sections in the multi-section thermoelectric heat pump.

5. A multi-section counter-flow thermoelectric heat pump system as claimed in claim 4, and in which each section includes a plurality of fins to enhance the heat exchange in each section.

6. A multi-section counter-flow thermoelectric heat pump as claimed in claim 4, and in which the coefficient of performance of all sections are made equal, to optimize the efficiency of the entire heat pump.

7. A multi-section thermoelectric heat pump as claimed in claim 6, in which the coefficient of performance is made the same for each section by adjusting the geometry of the thermoelectric modules in each individual section.

8. A multi-section thermoelectric heat pump as claimed in claim 6, in which the coefficient of performance is made the same by adjusting the temperature distribution in each heat exchanger section.

* * * * *